US009123445B2

(12) United States Patent
Ellis et al.

(10) Patent No.: US 9,123,445 B2
(45) Date of Patent: Sep. 1, 2015

(54) STORAGE CONTROL SYSTEM WITH DATA MANAGEMENT MECHANISM AND METHOD OF OPERATION THEREOF

(71) Applicant: SMART Storage Systems, Inc., Chandler, AZ (US)

(72) Inventors: Robert W. Ellis, Phoenix, AZ (US); James Fitzpatrick, Sudbury, MA (US); Mark Dancho, Chandler, AZ (US); Michelle Martin, Westford, MA (US)

(73) Assignee: SMART STORAGE SYSTEMS, INC., Milpitas, CA (US)

( * ) Notice: Subject to any disclaimer, the term of this patent is extended or adjusted under 35 U.S.C. 154(b) by 202 days.

(21) Appl. No.: 13/746,542

(22) Filed: Jan. 22, 2013

(65) Prior Publication Data

US 2014/0208174 A1 Jul. 24, 2014

(51) Int. Cl.
G11C 29/50 (2006.01)
G06F 11/10 (2006.01)
G11C 16/26 (2006.01)
G11C 29/54 (2006.01)
G11C 29/56 (2006.01)
G11C 29/48 (2006.01)
G11C 16/04 (2006.01)

(52) U.S. Cl.
CPC ...... *G11C 29/50004* (2013.01); *G06F 11/1048* (2013.01); *G11C 16/26* (2013.01); *G11C 16/04* (2013.01); *G11C 29/48* (2013.01); *G11C 29/50* (2013.01); *G11C 29/56* (2013.01)

(58) Field of Classification Search
CPC .. G11C 29/50004; G11C 16/26; G11C 29/56; G11C 29/48; G11C 29/50; G11C 16/04; G06F 11/1048

See application file for complete search history.

(56) References Cited

U.S. PATENT DOCUMENTS

| 4,048,481 | A | 9/1977 | Bailey, Jr. et al. |
| 4,839,587 | A | 6/1989 | Flatley et al. |
| 5,034,744 | A | 7/1991 | Obinata |
| 5,210,854 | A | 5/1993 | Beaverton et al. |
| 5,311,395 | A | 5/1994 | McGaha et al. |
| 5,450,354 | A | 9/1995 | Sawada et al. |
| 5,479,638 | A | 12/1995 | Assar et al. |
| 5,784,174 | A | 7/1998 | Fujino et al. |
| 5,790,828 | A | 8/1998 | Jost |

(Continued)

FOREIGN PATENT DOCUMENTS

| EP | 1 956 489 A2 | 8/2008 |
| EP | 1 990 921 A2 | 11/2008 |

(Continued)

OTHER PUBLICATIONS

Ulinktech, "ATA Command Table (in Alphabetic Order)," Feb. 6, 2011, https://web.archive.org/web/20110206060820/http://www.ulinktech.com/downloads/AT, 6 pages.

(Continued)

*Primary Examiner* — April Y Blair
*Assistant Examiner* — Dipakkumar Gandhi
(74) *Attorney, Agent, or Firm* — Morgan, Lewis & Bockius LLP

(57) ABSTRACT

A method of operation of a storage control system includes: determining a bit error rate of a page; calculating a slope based on the bit error rate; and adjusting a threshold voltage for the page based on the slope for reading a memory device.

19 Claims, 5 Drawing Sheets

(56) References Cited

U.S. PATENT DOCUMENTS

| | | | |
|---|---|---|---|
| 5,930,504 A | 7/1999 | Gabel | |
| 5,949,785 A | 9/1999 | Beasley | |
| 5,963,983 A | 10/1999 | Sakakura et al. | |
| 6,069,827 A | 5/2000 | Sinclair | |
| 6,091,652 A | 7/2000 | Haehn et al. | |
| 6,275,436 B1 | 8/2001 | Tobita et al. | |
| 6,345,367 B1 | 2/2002 | Sinclair | |
| 6,356,447 B2 | 3/2002 | Scafidi | |
| 6,381,670 B1 | 4/2002 | Lee et al. | |
| 6,412,080 B1 | 6/2002 | Fleming et al. | |
| 6,529,997 B1 | 3/2003 | Debiez et al. | |
| 6,552,581 B1 | 4/2003 | Gabara | |
| 6,587,915 B1 | 7/2003 | Kim | |
| 6,618,249 B2 | 9/2003 | Fairchild | |
| 6,661,503 B1 * | 12/2003 | Yamaguchi et al. | 356/73.1 |
| 6,728,913 B1 | 4/2004 | Parker | |
| 6,763,424 B2 | 7/2004 | Conley | |
| 6,775,792 B2 | 8/2004 | Ulrich et al. | |
| 6,778,387 B2 | 8/2004 | Fairchild | |
| 6,850,443 B2 | 2/2005 | Lofgren et al. | |
| 6,854,070 B2 | 2/2005 | Johnson et al. | |
| 6,871,304 B2 * | 3/2005 | Hadjihassan et al. | 714/704 |
| 6,903,972 B2 | 6/2005 | Lasser et al. | |
| 6,906,961 B2 | 6/2005 | Eggleston et al. | |
| 6,975,028 B1 | 12/2005 | Wayburn et al. | |
| 7,082,495 B2 | 7/2006 | DeWhitt et al. | |
| 7,107,389 B2 | 9/2006 | Inagaki et al. | |
| 7,139,864 B2 | 11/2006 | Bennett et al. | |
| 7,233,497 B2 | 6/2007 | Simon et al. | |
| 7,243,186 B2 | 7/2007 | Liang et al. | |
| 7,298,888 B2 * | 11/2007 | Hamar | 382/151 |
| 7,330,927 B1 | 2/2008 | Reeve et al. | |
| 7,333,364 B2 | 2/2008 | Yu et al. | |
| 7,350,101 B1 | 3/2008 | Nguyen et al. | |
| 7,355,896 B2 | 4/2008 | Li et al. | |
| 7,434,122 B2 | 10/2008 | Jo | |
| 7,441,067 B2 | 10/2008 | Gorobets et al. | |
| 7,516,267 B2 | 4/2009 | Coulson et al. | |
| 7,613,871 B2 | 11/2009 | Tanaka et al. | |
| 7,620,710 B2 | 11/2009 | Kottomtharayil et al. | |
| 7,620,769 B2 | 11/2009 | Lee et al. | |
| 7,639,532 B2 | 12/2009 | Roohparvar et al. | |
| 7,661,054 B2 | 2/2010 | Huffman et al. | |
| 7,679,948 B2 | 3/2010 | Park et al. | |
| 7,693,422 B2 * | 4/2010 | Alicherry et al. | 398/58 |
| 7,738,502 B2 | 6/2010 | Chang et al. | |
| 7,743,216 B2 | 6/2010 | Lubbers et al. | |
| 7,818,525 B1 | 10/2010 | Frost et al. | |
| 7,827,348 B2 | 11/2010 | Lee et al. | |
| 7,830,164 B2 | 11/2010 | Earle et al. | |
| 7,979,614 B1 | 7/2011 | Yang | |
| 8,001,135 B2 | 8/2011 | Perlmutter et al. | |
| 8,010,738 B1 | 8/2011 | Chilton et al. | |
| 8,028,123 B2 | 9/2011 | Kilzer et al. | |
| 8,046,645 B2 | 10/2011 | Hsu et al. | |
| 8,051,241 B2 | 11/2011 | Feldman et al. | |
| 8,072,805 B2 | 12/2011 | Chou et al. | |
| 8,095,724 B2 | 1/2012 | Ji et al. | |
| 8,095,765 B2 | 1/2012 | Asnaashari et al. | |
| 8,117,396 B1 | 2/2012 | Fair et al. | |
| 8,127,202 B2 | 2/2012 | Cornwell et al. | |
| 8,145,984 B2 | 3/2012 | Sommer et al. | |
| 8,154,921 B2 | 4/2012 | Mokhlesi et al. | |
| 8,169,825 B1 | 5/2012 | Shalvi et al. | |
| 8,209,677 B2 | 6/2012 | Shintani et al. | |
| 8,219,724 B1 | 7/2012 | Caruso et al. | |
| 8,219,776 B2 | 7/2012 | Forhan et al. | |
| 8,228,701 B2 | 7/2012 | Sokolov et al. | |
| 8,245,101 B2 | 8/2012 | Olbrich et al. | |
| 8,250,621 B2 | 8/2012 | Cha | |
| 8,254,172 B1 | 8/2012 | Kan | |
| 8,259,506 B1 | 9/2012 | Sommer et al. | |
| 8,289,801 B2 | 10/2012 | Smith et al. | |
| 8,296,534 B1 | 10/2012 | Gupta et al. | |
| 8,332,578 B2 | 12/2012 | Frickey, III et al. | |
| 8,363,413 B2 | 1/2013 | Paquette et al. | |
| 8,369,141 B2 | 2/2013 | Sommer et al. | |
| 8,386,700 B2 | 2/2013 | Olbrich et al. | |
| 8,386,860 B2 * | 2/2013 | Tseng et al. | 714/721 |
| 8,407,409 B2 | 3/2013 | Kawaguchi | |
| 8,464,106 B2 | 6/2013 | Filor et al. | |
| 8,503,238 B1 * | 8/2013 | Wu et al. | 365/185.09 |
| 8,601,203 B2 | 12/2013 | Holbrook et al. | |
| 8,612,804 B1 | 12/2013 | Kang et al. | |
| 8,661,184 B2 | 2/2014 | Wood et al. | |
| 8,832,506 B2 | 9/2014 | Griffin et al. | |
| 2002/0056025 A1 | 5/2002 | Qiu et al. | |
| 2002/0159285 A1 | 10/2002 | Morley et al. | |
| 2003/0033308 A1 | 2/2003 | Patel et al. | |
| 2003/0046603 A1 | 3/2003 | Harari et al. | |
| 2003/0074592 A1 | 4/2003 | Hasegawa | |
| 2003/0163633 A1 | 8/2003 | Aasheim et al. | |
| 2004/0080985 A1 | 4/2004 | Chang et al. | |
| 2004/0088511 A1 | 5/2004 | Bacon et al. | |
| 2004/0252670 A1 | 12/2004 | Rong et al. | |
| 2005/0021904 A1 | 1/2005 | Iaculo et al. | |
| 2005/0038792 A1 | 2/2005 | Johnson | |
| 2005/0073884 A1 | 4/2005 | Gonzalez et al. | |
| 2005/0076102 A1 | 4/2005 | Chen et al. | |
| 2005/0144516 A1 | 6/2005 | Gonzalez et al. | |
| 2006/0015683 A1 | 1/2006 | Ashmore et al. | |
| 2006/0020745 A1 | 1/2006 | Conley et al. | |
| 2006/0022054 A1 | 2/2006 | Elhamias et al. | |
| 2006/0136682 A1 | 6/2006 | Haridas et al. | |
| 2006/0143365 A1 | 6/2006 | Kikuchi | |
| 2006/0143475 A1 | 6/2006 | Herbert et al. | |
| 2006/0253641 A1 | 11/2006 | Gatzemeier et al. | |
| 2006/0256624 A1 | 11/2006 | Eggleston et al. | |
| 2006/0282644 A1 | 12/2006 | Wong | |
| 2006/0294574 A1 | 12/2006 | Cha | |
| 2007/0050536 A1 | 3/2007 | Kolokowsky | |
| 2007/0061511 A1 | 3/2007 | Faber | |
| 2007/0067598 A1 | 3/2007 | Fujimoto | |
| 2007/0083779 A1 | 4/2007 | Misaka et al. | |
| 2007/0226592 A1 | 9/2007 | Radke | |
| 2007/0234004 A1 | 10/2007 | Oshima et al. | |
| 2007/0260811 A1 | 11/2007 | Merry, Jr. et al. | |
| 2007/0263444 A1 | 11/2007 | Gorobets et al. | |
| 2007/0276973 A1 | 11/2007 | Tan et al. | |
| 2008/0046630 A1 | 2/2008 | Lasser | |
| 2008/0052446 A1 | 2/2008 | Lasser et al. | |
| 2008/0082736 A1 | 4/2008 | Chow et al. | |
| 2008/0126720 A1 | 5/2008 | Danilak | |
| 2008/0183918 A1 | 7/2008 | Dhokia et al. | |
| 2008/0189588 A1 | 8/2008 | Tanaka et al. | |
| 2008/0313505 A1 | 12/2008 | Lee et al. | |
| 2009/0006900 A1 | 1/2009 | Lastras-Montano et al. | |
| 2009/0019321 A1 | 1/2009 | Radke | |
| 2009/0070651 A1 | 3/2009 | Diggs et al. | |
| 2009/0083587 A1 | 3/2009 | Ng et al. | |
| 2009/0089485 A1 | 4/2009 | Yeh | |
| 2009/0091990 A1 | 4/2009 | Park et al. | |
| 2009/0109786 A1 | 4/2009 | Ye et al. | |
| 2009/0125670 A1 | 5/2009 | Keays | |
| 2009/0138654 A1 | 5/2009 | Sutardja | |
| 2009/0146721 A1 | 6/2009 | Kurooka et al. | |
| 2009/0157948 A1 | 6/2009 | Trichina et al. | |
| 2009/0164702 A1 | 6/2009 | Kern | |
| 2009/0164710 A1 | 6/2009 | Choi et al. | |
| 2009/0172262 A1 | 7/2009 | Olbrich et al. | |
| 2009/0179707 A1 | 7/2009 | Higashino | |
| 2009/0228634 A1 | 9/2009 | Nakamura et al. | |
| 2009/0228761 A1 | 9/2009 | Perlmutter et al. | |
| 2009/0259819 A1 | 10/2009 | Chen et al. | |
| 2009/0259896 A1 | 10/2009 | Hsu et al. | |
| 2009/0271562 A1 | 10/2009 | Sinclair | |
| 2009/0287975 A1 * | 11/2009 | Kim et al. | 714/746 |
| 2009/0300238 A1 | 12/2009 | Panabaker et al. | |
| 2009/0323419 A1 | 12/2009 | Lee et al. | |
| 2009/0327581 A1 | 12/2009 | Coulson | |
| 2009/0327591 A1 | 12/2009 | Moshayedi | |
| 2010/0017650 A1 | 1/2010 | Chin et al. | |
| 2010/0023674 A1 | 1/2010 | Aviles | |
| 2010/0050053 A1 | 2/2010 | Wilson et al. | |

(56) References Cited

U.S. PATENT DOCUMENTS

| | | |
|---|---|---|
| 2010/0122019 A1 | 5/2010 | Flynn et al. |
| 2010/0128537 A1 | 5/2010 | Suhail et al. |
| 2010/0138592 A1 | 6/2010 | Cheon |
| 2010/0165689 A1 | 7/2010 | Rotbard et al. |
| 2010/0169541 A1 | 7/2010 | Freikorn |
| 2010/0172179 A1 | 7/2010 | Gorobets et al. |
| 2010/0174845 A1 | 7/2010 | Gorobets et al. |
| 2010/0217898 A1 | 8/2010 | Priborsky et al. |
| 2010/0217915 A1 | 8/2010 | O'Connor et al. |
| 2010/0223531 A1 | 9/2010 | Fukutomi et al. |
| 2010/0228928 A1 | 9/2010 | Asnaashari et al. |
| 2010/0262792 A1 | 10/2010 | Hetzler et al. |
| 2010/0262795 A1 | 10/2010 | Hetzler et al. |
| 2010/0262875 A1 | 10/2010 | Hetzler et al. |
| 2010/0287328 A1 | 11/2010 | Feldman et al. |
| 2010/0293367 A1 | 11/2010 | Berke et al. |
| 2010/0312954 A1 | 12/2010 | Jeon et al. |
| 2010/0318719 A1 | 12/2010 | Keays et al. |
| 2010/0332726 A1 | 12/2010 | Wang |
| 2011/0002224 A1 | 1/2011 | Tamura |
| 2011/0016239 A1 | 1/2011 | Stenfort |
| 2011/0055468 A1 | 3/2011 | Gonzalez et al. |
| 2011/0066788 A1 | 3/2011 | Eleftheriou et al. |
| 2011/0072423 A1 | 3/2011 | Fukata |
| 2011/0078393 A1 | 3/2011 | Lin |
| 2011/0099342 A1 | 4/2011 | Ozdemir |
| 2011/0131365 A1 | 6/2011 | Zhang et al. |
| 2011/0131447 A1 | 6/2011 | Prakash et al. |
| 2011/0132000 A1 | 6/2011 | Deane et al. |
| 2011/0145473 A1 | 6/2011 | Maheshwari |
| 2011/0161775 A1 | 6/2011 | Weingarten |
| 2011/0190963 A1 | 8/2011 | Glassl et al. |
| 2011/0191522 A1 | 8/2011 | Condict et al. |
| 2011/0191649 A1 | 8/2011 | Lim et al. |
| 2011/0209032 A1 | 8/2011 | Choi et al. |
| 2011/0238892 A1 | 9/2011 | Tsai et al. |
| 2011/0239088 A1 | 9/2011 | Post |
| 2011/0258496 A1 | 10/2011 | Tseng et al. |
| 2011/0314219 A1 | 12/2011 | Ulrich et al. |
| 2011/0320687 A1 | 12/2011 | Belluomini et al. |
| 2012/0008401 A1 | 1/2012 | Katz et al. |
| 2012/0011336 A1 | 1/2012 | Saika |
| 2012/0047318 A1 | 2/2012 | Yoon et al. |
| 2012/0047320 A1 | 2/2012 | Yoo et al. |
| 2012/0047409 A1 | 2/2012 | Post et al. |
| 2012/0066450 A1 | 3/2012 | Yochai et al. |
| 2012/0096217 A1 | 4/2012 | Son et al. |
| 2012/0124046 A1 | 5/2012 | Provenzano |
| 2012/0124273 A1 | 5/2012 | Goss et al. |
| 2012/0151260 A1 | 6/2012 | Zimmermann et al. |
| 2012/0170365 A1 | 7/2012 | Kang et al. |
| 2012/0213004 A1* | 8/2012 | Yun et al. ............... 365/185.11 |
| 2012/0216085 A1 | 8/2012 | Weingarten et al. |
| 2012/0236656 A1 | 9/2012 | Cometti |
| 2012/0239858 A1 | 9/2012 | Melik-Martirosian |
| 2012/0254686 A1 | 10/2012 | Esumi et al. |
| 2012/0266048 A1 | 10/2012 | Chung et al. |
| 2012/0278530 A1 | 11/2012 | Ebsen |
| 2012/0278531 A1 | 11/2012 | Horn |
| 2012/0284587 A1 | 11/2012 | Yu et al. |
| 2012/0297113 A1 | 11/2012 | Belluomini et al. |
| 2012/0311402 A1 | 12/2012 | Tseng et al. |
| 2012/0324191 A1 | 12/2012 | Strange et al. |
| 2012/0331207 A1 | 12/2012 | Lassa et al. |
| 2013/0007380 A1 | 1/2013 | Seekins et al. |
| 2013/0007543 A1 | 1/2013 | Goss et al. |
| 2013/0054881 A1 | 2/2013 | Ellis et al. |
| 2013/0060994 A1 | 3/2013 | Higgins et al. |
| 2013/0073788 A1 | 3/2013 | Post et al. |
| 2013/0080691 A1 | 3/2013 | Weingarten et al. |
| 2013/0094289 A1* | 4/2013 | Sridharan et al. ........ 365/185.03 |
| 2013/0100600 A1 | 4/2013 | Yin et al. |
| 2013/0124792 A1 | 5/2013 | Melik-Martirosian et al. |
| 2013/0151753 A1 | 6/2013 | Jeon et al. |
| 2013/0198436 A1 | 8/2013 | Bandic et al. |
| 2013/0238833 A1 | 9/2013 | Vogan et al. |
| 2013/0265825 A1 | 10/2013 | Lassa |
| 2013/0332791 A1 | 12/2013 | Chu |
| 2014/0108891 A1 | 4/2014 | Strasser et al. |
| 2014/0129874 A1 | 5/2014 | Zaltsman et al. |
| 2014/0208174 A1* | 7/2014 | Ellis et al. ............... 714/721 |

FOREIGN PATENT DOCUMENTS

| | | | |
|---|---|---|---|
| EP | 2 498 259 A2 | 9/2012 | |
| JP | 2012129859 A * | 7/2012 | ............ H04W 16/28 |
| WO | WO 2009/042298 A1 | 4/2009 | |
| WO | WO 2011/156466 | 12/2011 | |

OTHER PUBLICATIONS

International Search Report and Written Opinion dated May 14, 2014, received in International Patent Application No. PCT/US2014/017168, which corresponds to U.S. Appl. No. 14/076,115, 6 pages (Fitzpatrick).

International Search Report and Written Opinion dated May 14, 2014, received in International Patent Application No. PCT/US2014/017169, which corresponds to U.S. Appl. No. 14/076,148, 6 pages (Fitzpatrick).

International Search Report dated Mar. 25, 2014, received in International Patent Application No. PCT/US2013/072400, which corresponds to U.S. Appl. No. 13/690,337, 3 pages (Ellis).

International Search Report and Written Opinion dated Jun. 12, 2014, received in PCT/US2014/018972, which corresponds to U.S. Appl. No. 13/779,352, 12 pages (Schmier).

Invitation to Pay Additional Fees dated Jul. 25, 2014, received in International Patent Application No. PCT/US2014/021290, which corresponds to U.S. Appl. No. 13/791,797, 8 pages (Dean).

International Search Report and Written Opinion dated Jul. 31, 2014, received in International Patent Application No. PCT/US2014/031465, which corresponds to U.S. Appl. No. 13/851,928, 13 pages (Ellis).

International Search Report and Written Opinion dated Jul. 31, 2014, received in International Patent Application No. PCT/US2014/033876, which corresponds to U.S. Appl. No. 13/861,326, 9 pages (Fitzpatrick).

International Search Report and Written Opinion dated Aug. 22, 2014, received in International Patent Application No. PCT/US2014/032978, which corresponds to U.S. Appl. No. 14/081,992 10 pages (Ellis).

Cooke, "Introduction to Flash Memory (T1A)," Flash Memory Summit, Aug. 22, 2008, Micron Technology, Inc., 102 pages.

Gal et al., "Algorithms and Data Structures for Flash Memories," ACM Computing Surveys, Jun. 2005, vol. 37, No. 2, 30 pages.

IBM Corporation, "Systems Management, Work Management," Version 5, Release 4, 9th Edition, Feb. 2006, pp. 1-21.

O'Brien, "SMART Storage Systems Systems Optimus SAS Enterprise SSD Review," SMART Storage Systems, Oct. 9, 2012, 44 pages.

Spanjer, "Flash Management—Why and How?" Smart Modular Technolgoies, Nov. 2009, http://www.scantec.de/fileadmin/pdf/Smart_Modular/Flash-Management.pdf, 14 pages.

Texas Instruments. "Power Management IC for Digital Set Top Boxes," SLVSA10A, Sep. 2009, pp. 1-22.

International Search Report and Written Opinion dated Dec. 20, 2013, received in PCT/US2013/045282, which corresponds to U.S. Appl. No. 13/493,949, 7 pages (Ellis).

Tseng et al., "Understanding the Impact of Power Loss on Flash Memory," DAC'11, Jun. 5-10, 2011, San Diego, California, 6 pages.

Narayanan et al., "Migrating Server Storage to SSDs: Analysis of Tradeoffs," Computer Systems, Apr. 2009, 12 pages.

Shiraz et al., "Block Aging Prevention Technique (BAP) for Flash Based Solid State Disks," 7th International Conference on Emerging Technologies (ICET), Sep. 5, 2011, 6 pages.

Tai et al, "Prolongation of Lifetime and the Evaluation Method of Dependable SSD," 25 International Symposium on Defect and Fault Tolerance in VLSI Systems, 2010, NJ, USA, 8 pages.

(56) References Cited

OTHER PUBLICATIONS

International Search Report and Written Opinion dated Jan. 9, 2015, received in International Patent Application No. PCT/US2014/049731, which corresponds to U.S. Appl. No. 14/334,324, 9 pages (Fitzpatrick).

International Search Report and Written Opinion dated Feb. 18, 2015, received in International Patent Application No. PCT/US2014/065401, which corresponds to U.S. Appl. No. 14/082,031, 9 pages (Higgins).

International Search Report dated Apr. 15, 2014, received in International Patent Application No. PCT/US2013/078340, which corresponds to U.S. Appl. No. 13/746,542, 11 pages (Ellis).

International Search Report and Written Opinion dated Nov. 7, 2014, received in International Patent Application No. PCT/US2014/049732, which corresponds to U.S. Appl. No. 14/334,350, 13 pages (Fitzpatrick).

International Search Report and Written Opinion dated Oct. 17, 2014, received in International Patent Application No. PCT/US2014/049734, which corresponds to U.S. Appl. No. 14/332,259, 8 pages (Higgins).

International Search Report and Written Opinion dated Oct. 23, 2014, received in International Patent Application No. PCT/US2014/049736, which corresponds to U.S. Appl. No. 14/446,249, 8 pages (Fitzpatrick).

International Search Report and Written Opinion dated Nov. 5, 2014, received in International Patent Application No. PCT/US2014/049282, which corresponds to U.S. Appl. No. 13/957,407, 12 pages (Fitzpatrick).

Yimo et al., "WeLe-RAID: A SSD-Based RAID for System Endurance and Performance," Jan. 2011, Network and Parallel Computing, Springer, 14 pages.

* cited by examiner ment, for adjusting a threshold voltage for the page based on the slope for reading a memory device.

Certain embodiments of the invention have other steps or elements in addition to or in place of those mentioned above. The steps or elements will become apparent to those skilled in the art from a reading of the following detailed description when taken with reference to the accompanying drawings.

STORAGE CONTROL SYSTEM WITH DATA MANAGEMENT MECHANISM AND METHOD OF OPERATION THEREOF

TECHNICAL FIELD

The present invention relates generally to a storage control system and more particularly to a system for data management.

BACKGROUND ART

Data storage, often called storage or memory, refers to computer components and recording media that retain digital data. Data storage is a core function and fundamental component of consumer and industrial electronics, especially devices such as computers, televisions, cellular phones, mobile devices, and digital video cameras.

Recently, forms of long-term storage other than electromechanical hard disks have become feasible for use in computers. NOT-AND (NAND) flash is one form of non-volatile memory used in solid-state storage devices. The memory cells are arranged in typical row and column fashion with circuitry for accessing individual cells. The memory transistors of those cells are placed to store an analog value that can be interpreted to hold two logical states in the case of Single Level Cell (SLC) or more than two logical states in the case of Multi Level Cell (MLC).

A flash memory cell is light in weight, occupies very little space, and consumes less power than electromechanical disk drives. Construction of a storage system with this type of memory allows for much higher bandwidths and input/output operations per second (IOPS) than typical electromechanical disk drives. More importantly, it is especially rugged and can operate at a much high temperature range. It will withstand without adverse effects repeated drops, each of which would destroy a typical electromechanical hard disk drive. A problem exhibited by flash memory is that it tends to have a limited life in use.

Thus, a need still remains for better data management devices. In view of the increasing demand for data management devices, it is increasingly critical that answers be found to these problems. In view of the ever-increasing commercial competitive pressures, along with growing consumer expectations and the diminishing opportunities for meaningful product differentiation in the marketplace, it is critical that answers be found for these problems. Additionally, the need to reduce costs, improve efficiencies and performance, and meet competitive pressures adds an even greater urgency to the critical necessity for finding answers to these problems.

Solutions to these problems have been long sought but prior developments have not taught or suggested any solutions and, thus, solutions to these problems have long eluded those skilled in the art.

DISCLOSURE OF THE INVENTION

The present invention provides a method of operation of a storage control system, including: determining a bit error rate of a page; calculating a slope based on the bit error rate; and adjusting a threshold voltage for the page based on the slope for reading a memory device.

The present invention provides a storage control system, including: a measurement module for determining a bit error rate of a page; a calculation module, coupled to the measurement module, for calculating a slope based on the bit error rate; and an adjustment module, coupled to the calculation

BEST MODE FOR CARRYING OUT THE INVENTION

Figure 1:
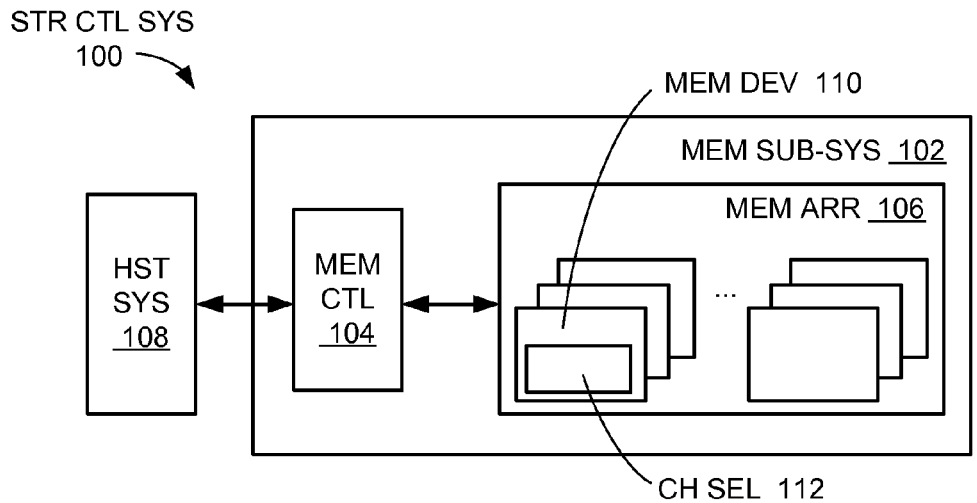
FIG. 1 is a storage control system with data management mechanism in an embodiment of the present invention.

The following embodiments are described in sufficient detail to enable those skilled in the art to make and use the invention. It is to be understood that other embodiments would be evident based on the present disclosure, and that system, process, or mechanical changes may be made without departing from the scope of the present invention.

In the following description, numerous specific details are given to provide a thorough understanding of the invention. However, it will be apparent that the invention may be practiced without these specific details. In order to avoid obscuring the present invention, some well-known circuits, system configurations, and process steps are not disclosed in detail.

The drawings showing embodiments of the system are semi-diagrammatic and not to scale and, particularly, some of the dimensions are for the clarity of presentation and are shown exaggerated in the drawing FIGs.

Where multiple embodiments are disclosed and described having some features in common, for clarity and ease of illustration, description, and comprehension thereof, similar and like features one to another will ordinarily be described with similar reference numerals. The embodiments have been numbered first embodiment, second embodiment, etc. as a matter of descriptive convenience and are not intended to have any other significance or provide limitations for the present invention.

The term "module" referred to herein can include software, hardware, or a combination thereof in the present invention in accordance with the context in which the term is used. For example, the software can be machine code, firmware, embedded code, and application software. Also for example, the hardware can be circuitry, processor, computer, integrated circuit, integrated circuit cores, a microelectromechanical system (MEMS), passive devices, environmental sensors including temperature sensors, or a combination thereof.

Referring now to FIG. 1, therein is shown a storage control system 100 with data management mechanism in an embodiment of the present invention. The storage control system 100 includes a memory sub-system 102 having a memory controller 104 and a memory array 106. The storage control system 100 includes a host system 108 communicating with the memory sub-system 102.

The memory controller 104 provides data control and management of the memory array 106. The memory controller 104 interfaces with the host system 108 and controls the memory array 106 to transfer data between the host system 108 and the memory array 106.

The memory array 106 includes an array of memory devices 110 including flash memory devices or non-volatile memory devices. The memory array 106 can include pages of data or information. The host system 108 can request the memory controller 104 for reading, writing, and deleting data from or to a logical address space of a storage device or the memory sub-system 102 that includes the memory array 106.

The memory devices 110 can include chip selects 112, which are defined as control inputs, for enabling the memory devices 110. Each of the chip selects 112 can be used to control the operation of one of the memory devices 110. Each of the chip selects 112 can be used to control sub addresses or logical units (LUNs) within each of the memory devices 110. When the chip selects 112 are enabled, the memory devices 110 are in active state for operation including reading, writing, or erasing.

Figure 2:
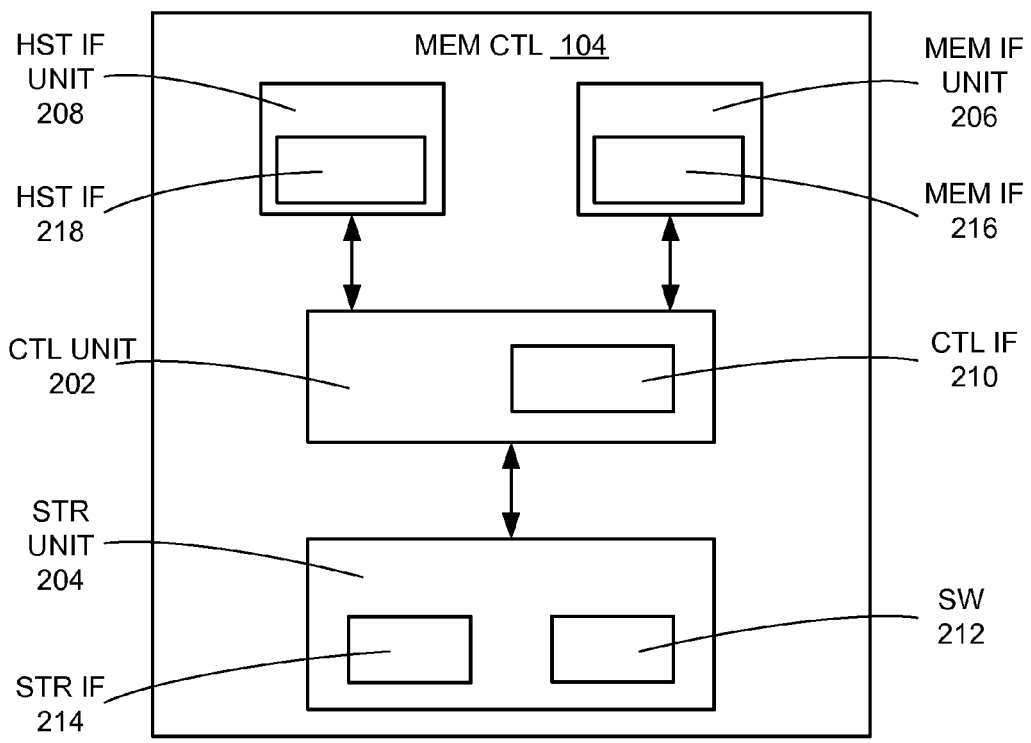
FIG. 2 is an exemplary hardware block diagram of the memory controller.

Referring now to FIG. 2, therein is shown an exemplary hardware block diagram of the memory controller 104. The memory controller 104 can include a control unit 202, a storage unit 204, a memory interface unit 206, and a host interface unit 208. The control unit 202 can include a control interface 210. The control unit 202 can execute software 212 stored in the storage unit 204 to provide the intelligence of the memory controller 104.

The control unit 202 can be implemented in a number of different manners. For example, the control unit 202 can be a processor, an embedded processor, a microprocessor, a hardware control logic, a hardware finite state machine (FSM), a digital signal processor (DSP), or a combination thereof.

The control interface 210 can be used for communication between the control unit 202 and other functional units in the memory controller 104. The control interface 210 can also be used for communication that is external to the memory controller 104.

The control interface 210 can receive information from the other functional units or from external sources, or can transmit information to the other functional units or to external destinations. The external sources and the external destinations refer to sources and destinations external to the memory controller 104.

The control interface 210 can be implemented in different ways and can include different implementations depending on which functional units or external units are being interfaced with the control interface 210. For example, the control interface 210 can be implemented with a dedicated hardware including an application-specific integrated circuit (ASIC), a configurable hardware including a field-programmable gate array (FPGA), a discrete electronic hardware, or a combination thereof.

The storage unit 204 can include both hardware and the software 212. For example, the software 212 can include control firmware. The storage unit 204 can include a volatile memory, a nonvolatile memory, an internal memory, an external memory, or a combination thereof. For example, the storage unit 204 can be a nonvolatile storage such as non-volatile random access memory (NVRAM), Flash memory, disk storage, or a volatile storage such as static random access memory (SRAM).

The storage unit 204 can include a storage interface 214. The storage interface 214 can also be used for communication that is external to the memory controller 104. The storage interface 214 can receive information from the other functional units or from external sources, or can transmit information to the other functional units or to external destinations. The external sources and the external destinations refer to sources and destinations external to the memory controller 104.

The storage interface 214 can include different implementations depending on which functional units or external units are being interfaced with the storage unit 204. The storage interface 214 can be implemented with technologies and techniques similar to the implementation of the control interface 210.

The memory interface unit 206 can enable external communication to and from the memory controller 104. For example, the memory interface unit 206 can permit the memory controller 104 to communicate with the memory array 106 of FIG. 1.

The memory interface unit 206 can include a memory interface 216. The memory interface 216 can be used for communication between the memory interface unit 206 and other functional units in the memory controller 104. The memory interface 216 can receive information from the other functional units or can transmit information to the other functional units.

The memory interface 216 can include different implementations depending on which functional units are being interfaced with the memory interface unit 206. The memory interface 216 can be implemented with technologies and techniques similar to the implementation of the control interface 210.

The host interface unit 208 allows the host system 108 of FIG. 1 to interface and interact with the memory controller 104. The host interface unit 208 can include a host interface 218 to provide communication mechanism between the host interface unit 208 and the host system 108.

The control unit 202 can operate the host interface unit 208 to send control or status information generated by the memory controller 104 to the host system 108. The control unit 202 can also execute the software 212 for the other functions of the memory controller 104. The control unit 202 can further execute the software 212 for interaction with the memory array 106 via the memory interface unit 206.

The functional units in the memory controller 104 can work individually and independently of the other functional units. For illustrative purposes, the memory controller 104 is described by operation of the memory controller 104 with the host system 108 and the memory array 106. It is understood that the memory controller 104, the host system 108, and the memory array 106 can operate any of the modules and functions of the memory controller 104.

Figure 3:
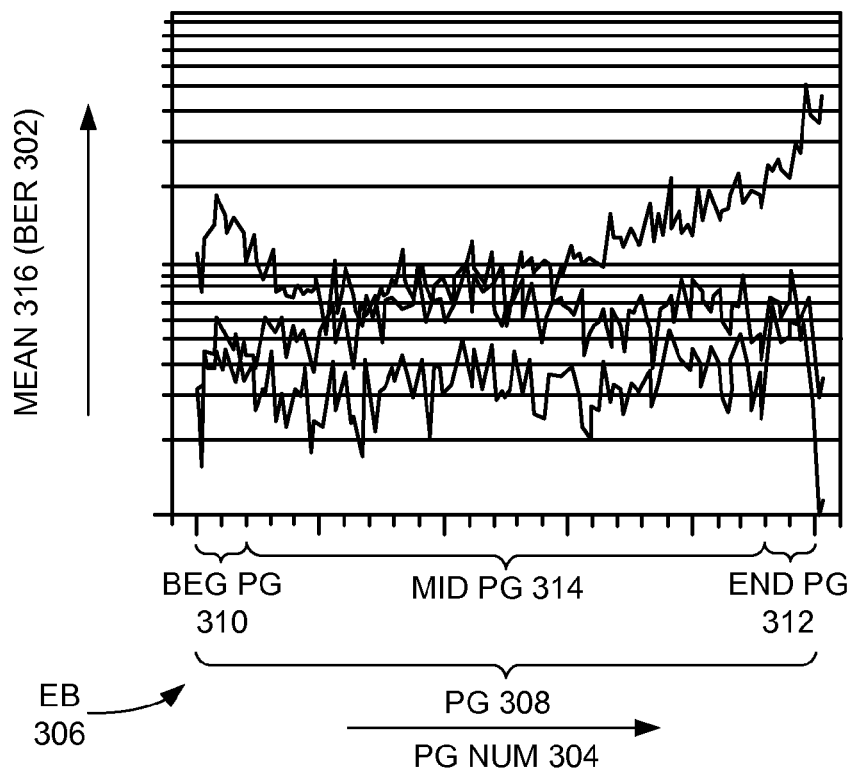
FIG. 3 is a first example graph of bit error rates.

Referring now to FIG. 3, therein is shown a first example graph of bit error rates 302. The bit error rates 302 (BER) are defined as numbers of incorrect bits in a data stream stored in the memory devices 110 of FIG. 1. The incorrect bits can be detected within a code word protected by error-correcting code (ECC). The code word refers to a group of data bytes covered by a single instance of multiple ECC parity words. The error-correcting code refers to parity or redundant data generated over a set of host or user data grouped into the code word.

The first example graph depicts the bit error rates 302 versus page numbers 304 at different settings for a read threshold (Vth). The page numbers 304 are defined as numerical values indicating which smallest groups of data bytes that are read from or written to in an erase block 306. The erase block 306 is defined as a group with the smallest number of pages 308 that are erased at a time. The pages 308 are defined as the smallest group of data bytes that are read from or written to in the erase block 306. The pages 308 are also referred to memory components within the erase block 306 that are programmed as individual units.

For example, the read threshold can be used to determine a digital value stored in a NAND cell of the memory devices 110. Also for example, the read threshold can be applied to internal NAND comparators, which determine digital values stored in NAND cells. Further, for example, the first example graph can include the bit error rates 302 for the page numbers 304 of the pages 308 that are fast pages or least significant bite pages, which refer to portions of blocks with fast speed in the memory devices 110 that have less time to program compared to other pages in the same blocks.

A mean 316 of the bit error rates 302, denoted as Mean (BER), per each of the page numbers 304 can be plotted in the first example graph. The mean 316 can be determined by calculating an average of the bit error rates 302 per each of the page numbers 304.

Relationship between the bit error rates 302 and the page numbers 304 can be determined. For example, the relationship can be determined using statistical methods including a bivariate fit of the mean 316 of the bit error rates 302 at each of the page numbers 304. The bivariate fit refers to a correlation analysis in statistics that is used to determine if two sets of paired data are statistically correlated. For example, the first example graph can include the mean 316 of the bit error rates 302 in a range from $1\ e^{-5}$ to $9\ e^{-4}$ in the vertical axis associated with the page numbers 304 in a range from 0 to 250 in the horizontal axis.

The first example graph depicts a graphical representation of the bit error rates 302 as a number of bit errors detected in each of the page numbers 304 in the erase block 306 at a set or predetermined value of the read threshold. An approximately flat line of the mean 316 of the bit error rates 302, where the mean 316 of the bit error rates 302 is relatively or approximately the same across all the page numbers 304 in the erase block 306, is an indication that the read threshold is set to a correct threshold value. The correct threshold value is a voltage level at which the read threshold is to be set resulting in the mean 316 of the bit error rates 302 relatively or approximately the same across all the page numbers 304 in the erase block 306.

When the page numbers 304 including lower numbered pages show or have the bit error rates 302 higher than the bit error rates 302 of the page numbers 304 of the pages 308 including upper numbered pages, it indicates that the read threshold values are set too negative relative to or lower than the correct threshold value. When the page numbers 304 including the lower numbered pages show or have the bit error rates 302 lower than the bit error rates 302 of the page numbers 304 including the upper numbered pages, it indicates that the read threshold values are set too positive relative to or higher than the correct threshold value.

As an example, the first example graph depicts an approximately flat line of the mean 316 of the bit error rates 302. In this example, the approximately flat line of the mean 316 can be determined when the read threshold is set to the correct threshold value of 2 volts.

As another example, the first example graph depicts the page numbers 304 of the lower numbered pages having the bit error rates 302 higher than the bit error rates 302 of the page numbers 304 of the upper numbered pages. In this example, the page numbers 304 of the lower numbered pages having the bit error rates 302 higher can be determined when the read threshold is set to −2 volts, which is too negative relative to or lower than the correct threshold value of 2 volts.

As a further example, the first example graph depicts the page numbers 304 of the lower numbered pages having the bit error rates 302 lower than the bit error rates 302 of the page numbers 304 of the upper numbered pages. In this example, the page numbers 304 of the lower numbered pages having the bit error rates 302 lower can be determined when the read threshold is set to 8 volts, which is too positive relative to or higher than the correct threshold value of 2 volts.

What is also shown in the graphs are beginning pages 310 and ending pages 312, both having an extreme difference in the bit error rates 302 compared to middle pages 314. The beginning pages 310 are defined as a range of the pages 308 at the beginning of the erase block 306. The ending pages 312 are defined as a range of the pages 308 at the end of the erase block 306. The beginning pages 310 and the ending pages 312 are memory units that are within a number of the pages 308 that are first and last programmed, respectively. The middle pages 314 are defined as a range of the pages 308 of the erase block 306 that are between the beginning pages 310 and the ending pages 312.

For example, the beginning pages 310 can include the pages 308 that are lower numbered pages of the erase block 306 including the page numbers 304 in a range of 0 to 5. Also for example, the ending pages 312 can include the pages 308 that are upper numbered pages of the erase block 306 including the page numbers 304 in a range of 249 to 255. As a specific example, the beginning pages 310, the middle pages 314, and the ending pages 312 can include the page numbers 304 in a range of 0 to 5, 6 to 248, and 249 to 255, respectively, out of 256 pages in the erase block 306.

Because of this extreme difference, it is important to be selective in which of the pages 308 of the erase block 306 are used to make measurements for correction slope calculations. This is also a gauge to what type of data can or cannot be stored in the beginning pages 310 and the ending pages 312. Critical metadata can be either stored in the middle pages 314, such as non-outlying pages, or written with a predetermined amount of redundant information as to reconstruct the metadata on a read failure.

Because the beginning pages 310 and the ending pages 312 can have extreme values of the bit error rates 302 when a current threshold adjustment is not correct yet, the beginning pages 310 and the ending pages 312 can be excluded from a slope measurement. Effects and locations of the beginning pages 310 and the ending pages 312 can differ depending on a type of memory used for the memory devices 110.

Depending on how the memory devices 110 react or function, sampling of the bit error rates 302 can be performed on a number of or all the pages 308 that are fast pages, slow pages, or a combination thereof. The sampling of the bit error rates 302 can be performed on one of the beginning pages 310, one of the ending pages 312, or a combination thereof. For example, the sampling of the bit error rates 302 can be performed on the page numbers 304 of 5 and 249.

For illustrative purposes, the first example graph depicts the bit error rates 302 measured once for every page in the erase block 306, although it is understood that the bit error rates 302 can be measured in a number of different manners or approaches. For example, during run-time, an approach is to only measure the bit error rates 302 on one of the beginning pages 310, one of the ending pages 312, one of the middle pages 314, or a combination thereof.

Figure 4:
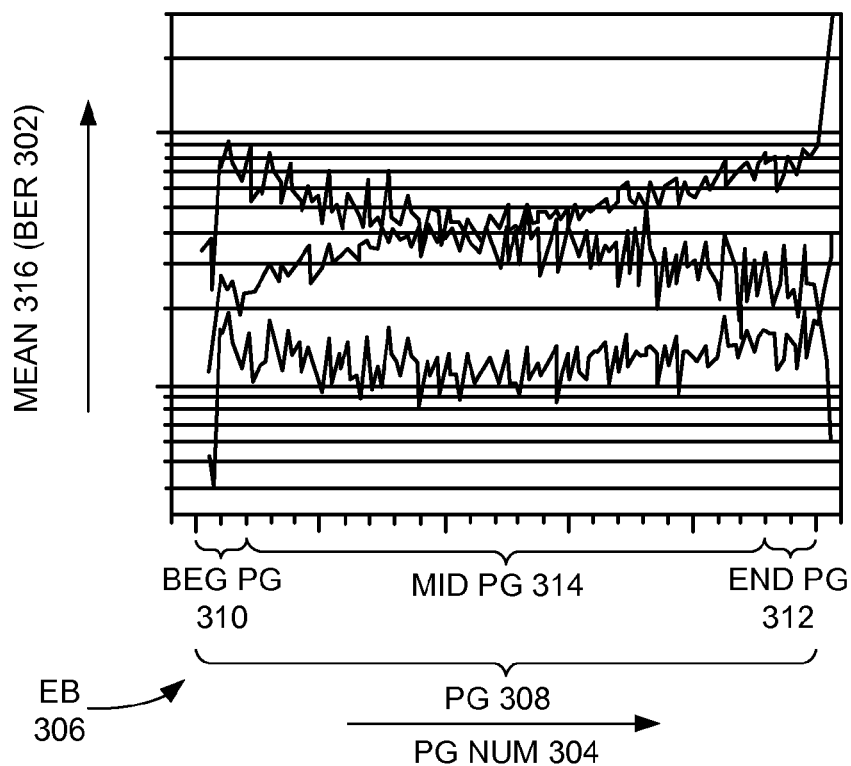
FIG. 4 is a second example graph of the bit error rates.

Referring now to FIG. 4, therein is shown a second example graph of the bit error rates. The bit error rates 302 (BER) are numbers of incorrect bits in a data stream stored in the memory devices 110 of FIG. 1. The incorrect bits can be detected within a code word protected by error-correcting code (ECC). The code word refers to a group of data bytes covered by a single instance of multiple ECC parity words. The error-correcting code refers to parity or redundant data generated over a set of host or user data grouped into the code word.

The second example graph depicts the bit error rates 302 versus the page numbers 304 at different settings for the read threshold. For example, the read threshold can be used to determine a digital value stored in a NAND cell of the memory devices 110. Also for example, the read threshold can be applied to internal NAND comparators, which determine digital values stored in NAND cells. Further, for example, the second example graph can include the bit error rates 302 for the page numbers 304 of the pages 308 that are slow pages or most significant bite pages, which refer to portions of blocks with slow speed in the memory devices 110 that need more time to program compared to other pages in the same blocks.

The mean 316 of the bit error rates 302, denoted as Mean (BER), per each of the page numbers 304 can be plotted in the second example graph. The mean 316 can be determined by calculating an average of the bit error rates 302 per each of the page numbers 304.

Relationship between the bit error rates 302 and the page numbers 304 can be determined. For example, the relationship can be determined using statistical methods including a bivariate fit of the mean 316 of the bit error rates 302 at each of the page numbers 304. The bivariate fit refers to a correlation analysis in statistics that is used to determine if two sets of paired data are statistically correlated. For example, the second example graph can include the mean 316 of the bit error rates 302 in a range from $3\,e^{-5}$ to $3\,e^{-3}$ in the vertical axis associated with the page numbers 304 in a range from 0 to 250 in the horizontal axis.

The second example graph depicts a graphical representation of the bit error rates 302 as a number of bit errors detected in each of the page numbers 304 in the erase block 306 at a set or predetermined value of the read threshold. An approximately flat line of the mean 316 of the bit error rates 302, where the mean 316 of the bit error rates 302 is relatively or approximately the same across all the page numbers 304 in the erase block 306, is an indication that the read threshold is set to the correct threshold value. The correct threshold value is defined as a voltage level at which the read threshold is set resulting in the mean 316 of the bit error rates 302 relatively or approximately the same across all the page numbers 304 in the erase block 306.

When the page numbers 304 including lower numbered pages show or have the bit error rates 302 higher than the bit error rates 302 of the page numbers 304 including upper numbered pages, it indicates that the read threshold values are set too negative relative to or lower than the correct threshold value. When the page numbers 304 including the lower numbered pages show or have the bit error rates 302 lower than the bit error rates 302 of the page numbers 304 including the upper numbered pages, it indicates that the read threshold values are set too positive relative to or higher than the correct threshold value.

As an example, the second example graph depicts an approximately flat line of the mean 316 of the bit error rates 302. In this example, the approximately flat line of the mean 316 occurs when the read threshold is set to the correct threshold value of 6 volts.

As another example, the second example graph depicts the page numbers 304 of the lower numbered pages having the bit error rates 302 higher than the bit error rates 302 of the page numbers 304 of the upper numbered pages. In this example, the page numbers 304 of the lower numbered pages having the bit error rates 302 higher can be determined when the read threshold is set to 0 volts, which is lower than the correct threshold value of 6 volts.

As a further example, the second example graph depicts the page numbers 304 of the lower numbered pages having the bit error rates 302 lower than the bit error rates 302 of the page numbers 304 of the upper numbered pages. In this example, the page numbers 304 of the lower numbered pages having the bit error rates 302 lower can be determined when the read threshold is set to 12 volts, which is too positive relative to or higher than the correct threshold value of 6 volts.

What is also shown in the graphs are the beginning pages 310 and the ending pages 312, both having an extreme difference in the bit error rates 302 compared to the middle pages 314. For example, the beginning pages 310 can include the pages 308 that are lower numbered pages of the erase block 306 including the page numbers 304 in a range of 0 to 5. Also for example, the ending pages 312 can include the pages 308 that are upper numbered pages of the erase block 306 including the page numbers 304 in a range of 249 to 255. As a specific example, the beginning pages 310, the middle pages 314, and the ending pages 312 can include the page numbers 304 in a range of 0 to 5, 6 to 248, and 249 to 255, respectively, out of 256 pages in the erase block 306.

Because of this extreme difference, it is important to be selective in which of the pages 308 of the erase block 306 are used to make measurements for correction slope calculations. This is also a gauge to what type of data can or cannot be stored in the beginning pages 310 and the ending pages 312. Critical metadata can be either stored in the middle pages 314, such as non-outlying pages, or written with a predetermined amount of redundant information as to reconstruct the metadata on a read failure.

Depending on how the memory devices 110 react or function, sampling of the bit error rates 302 can be performed on a number of or all the pages 308 including fast pages, slow pages, or a combination thereof. The sampling of the bit error rates 302 can be performed on one of the beginning pages 310, one of the ending pages 312, or a combination thereof. For example, the sampling of the bit error rates 302 can be performed on the pages 308 of 5 and 249.

For illustrative purposes, the second example graph depicts the bit error rates 302 measured once for every page in the erase block 306, although it is understood that the bit error rates 302 can be measured in a number of different manners or approaches. For example, during run-time, an approach is to only measure the bit error rates 302 on one of the beginning pages 310, one of the ending pages 312, one of the middle pages 314, or a combination thereof.

Both the fast pages and the slow pages, including the LSB pages and the MSB pages, respectively, show the same effect to the read threshold. An algorithm used to generate a graph of the mean 316 of the bit error rates 302 as a function of the page numbers 304 can ignore the beginning pages 310 and the ending pages 312 values, for example in FIGS. 3-4, to get best results.

The graphs in FIGS. 3-4 can represent measured data on the memory devices 110 including NAND devices, as an example. A value of the read threshold value associated with the bit error rates 302 is one of many control values that can be changed to affect resulting values of the bit error rates 302 from read operations.

Figure 5:
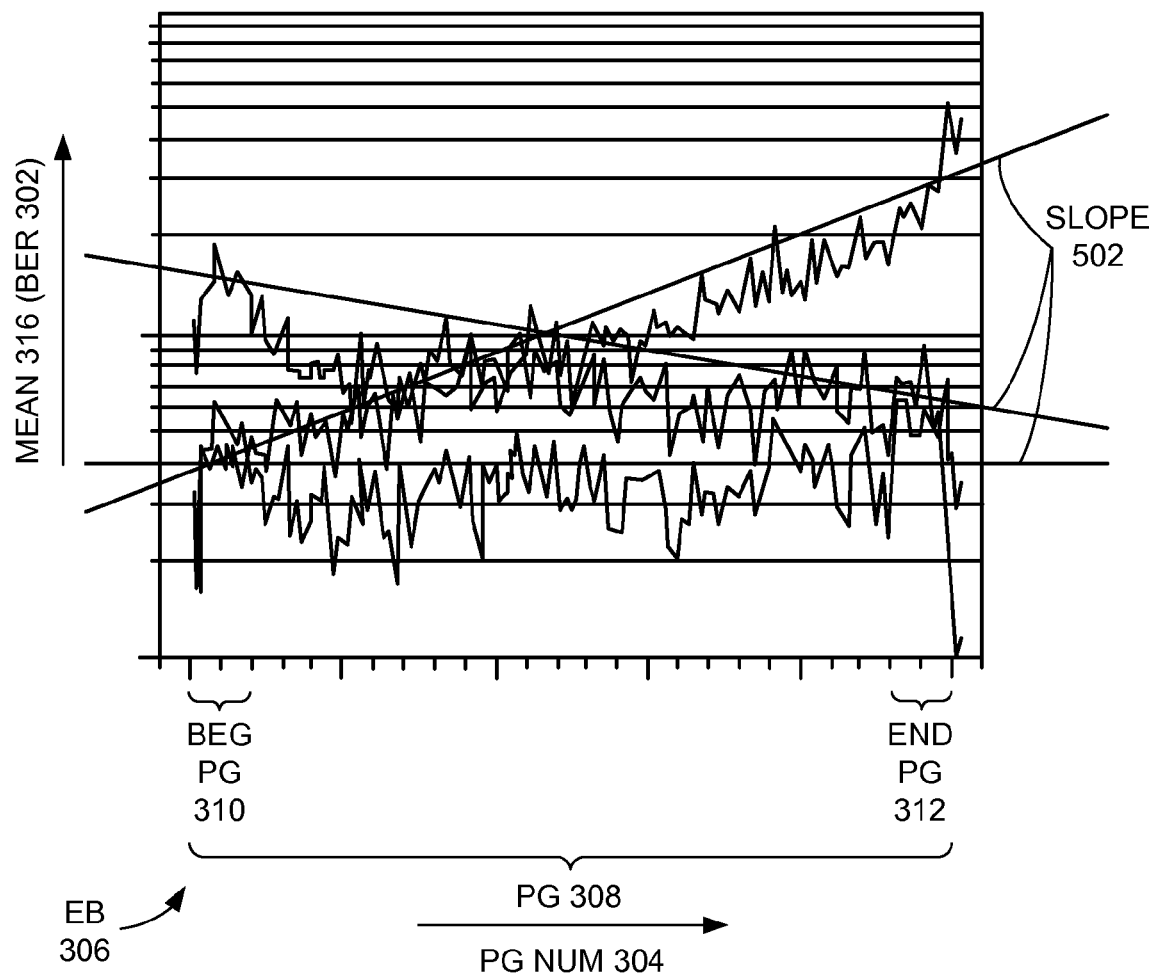
FIG. 5 is an example graph of a slope of the bit error rates.

Referring now to FIG. 5, therein is shown an example graph of a slope 502 of the bit error rates 302. The example graph of the slope 502 of the bit error rates 302 indicates direction and amount of the read threshold shift. The slope 502 is defined as a change in the mean 316 of the bit error rates 302 over a change in the page numbers 304. The slope 502 of the bit error rates 302 is a value derived from making multiple measurements of the bit error rates 302 on the pages 308 across the erase block 306 that is a target block.

The example graph shows how measurement of the bit error rates 302 can be used to generate a correction value, which is a numerical value used as a factor for adjustment of the read threshold to the correct threshold value. The correction value can include both amount of the correction value and a sign or direction of the correction value. For example, the example graph depicts the mean 316 of the bit error rates 302 in a range from $1\ e^{-5}$ to $9\ e^{-4}$ in the vertical axis associated with the page numbers 304 in a range from 0 to 250 in the horizontal axis.

When the mean 316 of the bit error rates 302 is relatively or approximately the same across all the page numbers 304 in the erase block 306, the slope 502 of the mean 316 of the bit error rates 302 over the page numbers 304 can be approximately horizontally flat or zero. The mean 316 of the bit error rates 302 can be relatively or approximately the same across all the page numbers 304 except for the beginning pages 310 and the ending pages 312.

The slope 502 can be approximately horizontally flat or zero when the read threshold is set to the correct threshold value. For example, the example graph depicts a slope represented by an approximately horizontally flat line of the mean 316 of the bit error rates 302, denoted as slope C, when the read threshold is set to the correct threshold value of 2 volts.

When the page numbers 304 including the lower numbered pages having the bit error rates 302 higher than the bit error rates 302 of the page numbers 304 including the upper numbered pages, the slope 502 is decreasing or negative. The slope 502 is decreasing when the read threshold is set too negative relative to or lower than the correct threshold value. For example, the example graph depicts the slope 502 decreasing, denoted as slope B, when the read threshold is set to −2 volts, which is lower than the correct threshold value of 2 volts.

When the page numbers 304 of the pages 308 including the lower numbered pages having the bit error rates 302 lower than the bit error rates 302 of the page numbers 304 of the pages 308 including the upper numbered pages, the slope 502 is too positive or higher than the correct threshold value. The slope 502 is increasing, denoted as slope A, when the read threshold is set too positive relative to or higher than the correct threshold value. For example, the example graph depicts the slope 502 increasing when the read threshold is set to 8 volts, which is higher than the correct threshold value of 2 volts.

By examining the amount of the slope 502 and the direction, based on the sign, of the slope 502, the read threshold values can be changed directly. The goal of this tuning operation is to generate the bit error rates 302 that result in the slope 502 value of approximately zero. The slope 502 value of approximately zero indicates that the bit error rates 302 values can be represented by an approximately horizontally flat line. Thus, the bit error rates 302 are independent of the page numbers 304. Measurements of the bit error rates 302 to generate the slope 502 can be made overtly by performing a separate set of read steps or as a result in normal read host or recycle read operations as the memory sub-system 102 of FIG. 1 or a solid state drive is in normal use.

As an example, the example graph depicts the slope 502 as slope A when the slope 502 is a strong positive slope, which in turn would require a reduction in the read threshold to normalize the bit error rates 302 across the page numbers 304.

Locations of the bit error rates 302 measurements can be chosen or selected to give maximum sensitivity to the measurements but avoid measurements of the beginning pages 310 and the ending pages 312, such as outlier pages. The measurements of the outlier pages can produce values of the bit error rates 302 that would be too great for adjustment of the read threshold.

Relationship between the bit error rates 302 and the page numbers 304 can be determined using statistical methods including the bivariate fit. The bivariate fit is a correlation analysis in statistics. The bivariate fit can be used to determine how two sets of paired data statistically correlated. The bivariate fit can be generated for the paired data using a linear regression line between data points plotted for the paired data.

The slope 502 of the linear regression line is a correlation coefficient. The closer the linear regression line is to a 45-degree angle, the more likely the paired data can be dependent on one another. If the linear regression line is flat or zero, there is no correlation between the data points.

Figure 6:
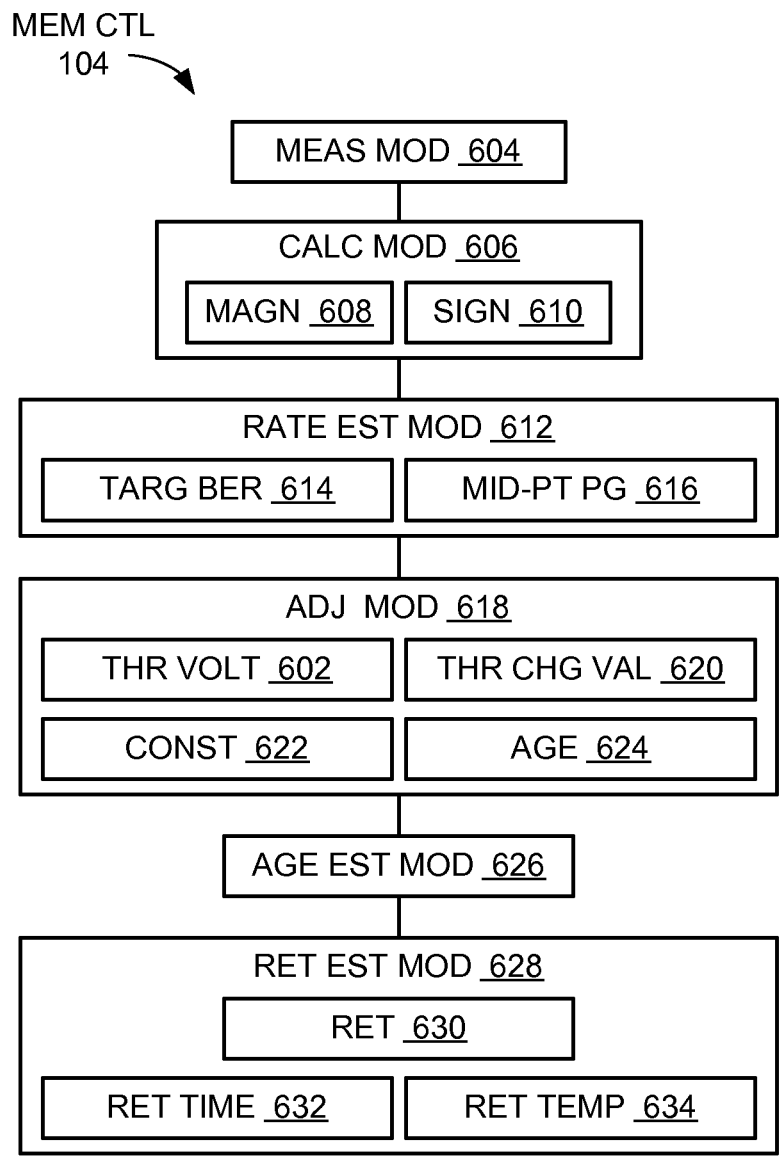
FIG. 6 is a control flow of the memory controller.

Referring now to FIG. 6, therein is shown a control flow of the memory controller 104. The control flow provides estimation techniques for setting or determining a threshold voltage 602 for read data. The threshold voltage 602 is defined as a voltage setting or level used in determining a digital value stored in a memory cell. The threshold voltage 602 includes the read threshold previously described.

The control flow can be applied to a design that uses a process to recover data after long retention times or an increase in data integrity at boot time. The goal of this process is to find a deterministic low time impact method of determining an optimum threshold voltage (Vth) setting for the memory devices 110 of FIG. 1 before or after a long period of retention.

During the normal operation of the storage control system 100 of FIG. 1 including an SSD, the storage control system 100 can be powered off and stored for an unknown period at an unknown temperature. Power on retention can also have the same problems at power off retention.

When the storage control system 100 is powered up again or the erase block 306 of FIG. 3 is being read from after data have been stored in the erase block 306 for a long period, analog voltages in the memory devices 110 including NAND cells can be shifted. The shift of the analog voltages can result in an increase or decrease in the bit error rates 302 of FIG. 3 from the last known or determined voltage threshold settings.

It is desirable to make key measurements of the bit error rates 302 to determine where to set the threshold voltage 602 including cell voltage thresholds on each operating die in the storage control system 100 to proceed with the boot and run time processes with the minimum amount of error recovery or read retries. Any number of overt read operations for purposes of determining correction settings can negatively impact or affect the performance and reliability of the storage control system 100. Therefore, it is important to devise a mechanism for quickly adjusting the threshold voltage 602 at power up. The mechanism or similar practices can also be applied to a running system.

The memory controller 104 can include a measurement module 604 to determine the bit error rates 302. The measurement module 604 can determine the bit error rates 302 by examining a number of the pages 308 of FIG. 3 in the erase block 306 to obtain values of the bit error rates 302. The bit error rates 302 can be used to estimate threshold settings for the threshold voltage 602 for the erase block 306.

Measurement of the bit error rates 302 can be made by performing a read operation on the pages 308 within the erase block 306. Data from the read operation can be passed through and processed by an ECC engine and be corrected. A number of bit corrections made by the ECC engine can be used to calculate the bit error rates 302.

The memory controller 104 can include a calculation module 606 to determine the slope 502 of FIG. 5. The calculation module 606 can determine the slope 502 by calculating a difference (or a ratio) in the bit error rates 302 between multiple measurements of the pages 308. The slope 502 can be calculated based on a change in the bit error rates 302 across the pages 308 in the erase block 306.

The difference can be used to estimate an amount of change for the threshold voltage 602 to get the best overall value for the threshold voltage 602. For example, one such procedure would be reading two of the pages 308 of 7 and 251, measure the bit error rates 302 for each of the two of the pages 308, and calculating the slope 502 of a line intersecting two points represented by the bit error rates 302 for the two of the pages 308.

A magnitude 608 and a sign 610 of the slope 502 can be used to directly predict or estimate an ideal read threshold voltage, which can be assigned to the threshold voltage 602. The magnitude 608 and the sign 610 can also be used in combination with other predetermined data including block program/erase (P/E) counts to estimate the ideal read threshold voltage.

The memory controller 104 can include a rate estimation module 612 to determine a target bit error rate 614. The target bit error rate 614 is defined as an error level to which the bit error rates 302 are to be adjusted by changing the threshold voltage 602. The target bit error rate 614 can be estimated by sampling mid-point pages 616, which are defined as the pages 308 with the least amount or a predetermined amount of changes for adjustment of the threshold voltage 602.

The sampling of the mid-point pages 616 can be used as estimation for the lowest target value of the bit error rates 302 overall for the erase block 306. Each of a number of the mid-point pages 616 can be sampled one time to determine the lowest target value of the bit error rates 302.

If the threshold voltage 602 for read operations is non-optimal, the pages 308 with the page numbers 304 of FIG. 3 in the middle of the erase block 306 can provide the best approximation of an optimal bit error rate at an optimal read threshold for the erase block 306. The term "non-optimal" refers to a difference in the bit error rates 302, between lowest and highest values of the page numbers 304 of the pages 308 that are read, greater than a predetermined error level with a given or predetermined setting of the threshold voltage 602.

The page numbers 304 in the middle of the erase block 306 provide a better guess or approximation of the optimal bit error rate than the page numbers 304 of the beginning pages 310 of FIG. 3 and the ending pages 312 of FIG. 3. For example, the page numbers 304 in the middle of the erase block 306 including mid-range page numbers can be 127, 128, or a combination thereof, in the case when there are 256 of the pages 308 in the erase block 306.

The memory controller 104 can include an adjustment module 618 to determine a threshold change value 620 for adjustment of the threshold voltage 602. The threshold change value 620 is defined as a numerical value used to adjust the threshold voltage 602. The threshold change value 620 includes the correction value previously described. The threshold change value 620 can be determined to adjust the threshold voltage 602 for reading data from the memory devices 110. The threshold change value 620 can be used to adjust the threshold voltage 602 to achieve the target bit error rate 614.

The threshold change value 620 can be generated based on the slope 502, a constant 622, and an age 624. The constant 622, denoted as K, is defined as a numerical value that is independent on the age 624. The constant 622 can be derived and predetermined as constant at various flash ages. The age 624 is defined as a numerical value used as a measure of an ability of memory cells for storing data. The age 624 can be associated with the pages 308 in the erase block 306.

The memory devices 110 are younger when a numerical value of the age 624 of the memory devices 110 is lower and thus can have better data-retention capability. The memory devices 110 that are older can have worse data-retention capability. The age 624 can be measured using or based on a number of methods including a P/E cycle count, the bit error rates 302, program times, the optimal read threshold, erase times, and or any other estimation methods of determining how worn the memory devices 110 are. The P/E cycle is a base-level operation of how data is replaced within the erase block 306. The memory devices 110 can have a limited number of useful P/E cycles.

The threshold change value 620 can be generated based on a product of the slope 502, the constant 622, and the age 624. In other words, the threshold change value 620 can be equal to SLOPE*K(age), where "SLOPE" is the slope 502, "K" is the constant 622, and "age" is the age 624. The constant 622 can be used so that the threshold change value 620 does not exceed a max programming value. For example, if a maximum value of the slope 502 were 1, the constant 622 would be 64 if the max programming value of the threshold voltage 602 were 64.

As the age 624 of the memory devices 110 increases, the P/E cycle count can increase and the program time can decrease. As the age 624 increases, the bit error rates 302 can increase. As the bit error rates 302 increase, the constant 622 can decrease to avoid being overly sensitive to a small percentage of change in the bit error rates 302. Therefore, the constant 622 can be proportional to the program time and inversely proportional to the P/E cycle count.

The threshold voltage 602 can be purposefully driven more negative or more positive depending on or based on which end or where a target instance of the pages 308 is located within the erase block 306. The target instance of the pages 308 is one of the pages 308 for which the threshold voltage 602 is to be adjusted. This approach allows the memory controller 104 to obtain lower values for the bit error rates 302 by adjusting the threshold voltage 602 not just at a level of the erase block 306 but optimized to individual levels of the pages 308. Specifically, the memory controller 104 can estimate the ideal read threshold voltage for one of the pages 308, assuming that the optimal read threshold is known or predetermined. This estimate can be faster to compute than sweeping a read threshold for each of the pages 308.

For example, the chart in FIG. 4 shows the slope 502 increasing. For the optimal read threshold in this example, the threshold voltage 602 can be adjusted by increasing the threshold voltage 602 by the threshold change value 620 when reading the beginning pages 310 and by decreasing the threshold voltage 602 by the threshold change value 620 when reading the ending pages 312.

As an example, when the threshold change value 620 is 6 volts, the threshold voltage 602 can be adjusted by adding 6 to the threshold voltage 602 when reading the lowest and first six of the pages 308 or by subtracting 6 from the threshold voltage 602 when reading the highest or last six of the pages 308. As such, better values of the bit error rates 302 can be provided on the beginning pages 310 and the ending pages 312 than a block-average optimum threshold.

The memory controller 104 can include an age estimation module 626 to determine the age 624 of the erase block 306. A change of a difference in the bit error rates 302 between the beginning pages 310 and the ending pages 312 for a given change in shift of the threshold voltage 602 by the threshold change value 620 can be used to estimate a current value of the age 624 and reliability of the erase block 306. For example, an increasing value of the optimal read threshold for the threshold voltage 602 can indicate that the age 624 is increasing.

The erase block 306 can wear as the program/erase (P/E) cycle count increases. As the erase block 306 wears, the optimal read threshold for the threshold voltage 602 can shift to the right or become more positive. A table of expected values associated with the shift of the optimal read threshold versus the age 624 of the erase block 306 can be built or generated based on how much the erase block 306 wears including the P/E cycle count.

If the threshold voltage 602 used for the erase block 306 is known to be optimal at N of the P/E cycle count (where N is a numerical value), an increase of a P/E wear including the P/E cycle count can be estimated by using the slope 502 of the bit error rates 302. The slope 502 of the bit error rates 302 can be used as an indicator of change in the optimal read threshold of the threshold voltage 602. The slope 502 of the bit error rates 302 can be used to estimate an amount of wear the erase block 306 has endured.

The memory controller 104 can include a retention estimation module 628 to determine a retention 630, which is defined as an amount of correct data after a given or predetermined period. The given or predetermined period can include a time that is independent of whether the storage control system 100 is powered on or powered off. The retention 630 is an ability of memory cells in the memory devices 110 to retain programmed or correct information.

The retention 630 can affect the threshold voltage 602 more than other parameters. A delta or a change in the bit error rates 302 among the pages 308 can be used to determine a placement of the optimal read threshold with respect to each other. For example, the delta or a change in the bit error rates 302 can be determined by the slope 502 including a linear-fit slope.

For example, after a period of the retention 630, the threshold voltage 602 associated with slope A in FIG. 5 shifts or changes only slightly, but the threshold voltage 602 associated with slope C in FIG. 5 has a larger shift compared to the threshold voltage 602 associated with slope A. In this example, the slope 502 can be used to individually drive the threshold voltage 602 of each of the pages 308 to its correct placement.

If the ideal read threshold voltage is known or determined prior to the period of the retention 630, the slope 502 of the bit error rates 302 using a previously known or predetermined ideal threshold voltage can provide an estimate of an effective value of a retention time 632. The term "effective" includes or is associated with time, temperature, or a combination thereof. The retention time 632 is defined as a period during which an amount of correct or programmed data is stored.

The retention time 632 can be quickly estimated to allow the storage control system 100 to specially or properly treat the amount of the correct or programmed data that has been stored. For example, the data can be rewritten as a fresh copy in the memory devices 110 to avoid excessive degradation.

A change in the slope 502 of the bit error rates 302 can be used to infer or estimate a retention temperature 634 if the retention time 632 is known. A change in the slope 502 of the bit error rates 302 can be used to infer or estimate the retention time 632 if the retention temperature 634 is known.

The retention temperature 634 is defined as an ability of memory cells in the memory devices 110 to retain programmed information based on a temperature at which data is held over a period. The retention 630 can be determined based on the retention time 632 and the retention temperature 634. The retention 630 can be determined based on a number of the P/E cycle count performed in the erase block 306 coupled with a period of time when data is held in the erase block 306 times the retention temperature 634 at which the data is held over the period.

The pages 308 in the erase block 306 can have lesser retention capabilities with an increased number of P/E cycles performed in the erase block 306. The pages 308 within the erase block 306 cannot be written more than one time without entirely erasing the erase block 306. The retention 630 of data of the erase block 306 can be influenced by a number of factors including a number of P/E cycles, when first and last program operations have been executed on the erase block 306, and the retention temperature 634 at which the memory devices 110 are being used or stored.

The retention 630 can be based on something close to but not limited to the retention time 632*the retention temperature 634, where the operator symbol "*" denotes multiply. As an example, the erase block 306 that was written 24 hours ago and held at 25° C. can have better retention than the erase block 306 that was written 24 hours ago and held at 60° C.

The retention temperature 634 can be an acceleration factor when it comes to the retention 630. Some minor healing effects can also be seen where a higher temperature for a short time can make the retention better.

The memory controller 104 in the storage control system 100 can determine both the retention time 632 and the retention temperature 634 associated with the retention time 632 to make decisions about when to rewrite data to avoid excessive retention decay. Retention properties including the retention time 632 and the retention temperature 634 can be non-constant over the life of the memory devices 110. Therefore, the P/E cycle count of the memory devices 110 can also be combined with the slope 502 of the bit error rates 302 to obtain more precise retention statistics.

Conversely, if the effective value of the retention time 632 is known, for example, in a power-on case of the storage control system 100, the change in the slope 502 of the bit error rates 302 for the retention time 632 can provide a measurement of the age 624 of the memory devices 110. The measurement of the age 624 can indicate remaining life or life used.

The approaches described above in FIGS. 3-5 can be generalized or applied to any type of the memory devices 110 that exhibits different values for the bit error rates 302 at different values of the threshold voltage 602 that is dependent on the page numbers 304.

It has been discovered that adjusting the threshold voltage 602 with the threshold change value 620 for the pages 308 based on the slope 502 by the adjustment module 618 provides improved reliability since the threshold voltage 602 is properly set to compensate for the shift of the analog voltages thereby providing reliable reading of data. The analog voltages are shifted when the storage control system 100 is powered up or the erase block 306 is read after the data have been stored in the erase block 306 for a long period.

It has also been discovered that calculating the slope 502 based on the bit error rates 302 by the calculation module 606 provides improved reliability since the magnitude 608 and the sign 610 of the slope 502 are used to properly adjust the threshold voltage 602 thereby providing reliable reading of the data.

It has further been discovered that determining the bit error rates 302 of the pages 308 by the measurement module 604 provides improved reliability since the bit error rates 302 are used to calculate the slope 502 to properly adjust the threshold voltage 602 thereby providing reliable reading of the data.

It has further been discovered that estimating the target bit error rate 614 for adjustment of the threshold voltage 602 by the rate estimation module 612 provides improved reliability since the target bit error rate 614 is estimated by sampling the mid-point pages 616 resulting in the lowest target value of the bit error rates 302.

It has further been discovered that increasing or decreasing the threshold voltage 602 with the threshold change value 620 when reading the beginning pages 310 or the ending pages 312 by the adjustment module 618 provides improved reliability since this approach allows the memory controller 104 to obtain lower values for the bit error rates 302. These lower values are obtained by adjusting the threshold voltage 602 not just at a level of the erase block 306 but optimized to individual levels of the pages 308.

It has further been discovered that estimating the age 624 of the erase block 306 based on the change of the difference in the bit error rates 302 and the change in the threshold voltage 602 since a proper estimation of the age 624 allows data in the erase block 306 to be rewritten timely to avoid excessive degradation.

It has further been discovered that estimating the retention time 632 and the retention temperature 634 by the retention estimation module 628 provides improved reliability since the retention time 632 and the retention temperature 634 allows the memory controller 104 to make decisions about when to rewrite data to avoid excessive retention decay.

Functions or operations of the memory controller 104 as described above can be implemented with the control unit 202 of FIG. 2, the storage unit 204 of FIG. 2, the memory interface unit 206 of FIG. 2, the host interface unit 208 of FIG. 2, or a combination thereof. For example, the measurement module 604 can be implemented with the control unit 202 to determine the bit error rates 302. Also for example, the calculation module 606 can be implemented with the control unit 202 to determine the slope 502 and calculate the magnitude 608 and the sign 610 of the slope 502.

For example, the rate estimation module 612 can be implemented with the control unit 202 to determine the target bit error rate 614. Also for example, the adjustment module 618 can be implemented with the control unit 202 to determine the threshold change value 620.

For example, the age estimation module 626 can be implemented with the control unit 202 to determine the age 624 of the erase block 306. Also for example, the retention estimation module 628 can be implemented with the control unit 202 to determine the retention 630.

The measurement module 604 can be coupled to the calculation module 606. The calculation module 606 can be coupled to the rate estimation module 612. The rate estimation module 612 can be coupled to the adjustment module 618. The adjustment module 618 can be coupled to the age estimation module 626. The age estimation module 626 can be coupled to the retention estimation module 628.

The physical transformation of adjusting the threshold voltage 602 for the pages 308 for reading from the memory devices 110 results in movement in the physical world, such as people using the memory sub-system 102 of FIG. 1 based on the operation of the storage control system 100. As the movement in the physical world occurs, the movement itself creates additional information that is converted back in to determine the bit error rates 302 and calculate the slope 502 for the continued operation of the storage control system 100 and to continue the movement in the physical world.

The storage control system 100 is described module functions or order as an example. The modules can be partitioned differently. For example, the age estimation module 626 and the retention estimation module 628 can be combined. Each of the modules can operate individually and independently of the other modules.

Furthermore, data generated in one module can be used by another module without being directly coupled to each other. For example, the age estimation module 626 can receive the bit error rates 302 from the measurement module 604 to estimate the age 624. The measurement module 604, the calculation module 606, the rate estimation module 612, the adjustment module 618, the age estimation module 626, and the retention estimation module 628 can be implemented as hardware accelerators (not shown) within the control unit 202 or can be implemented as hardware accelerators (not shown) in the memory controller 104 or outside of the memory controller 104.

Figure 7:
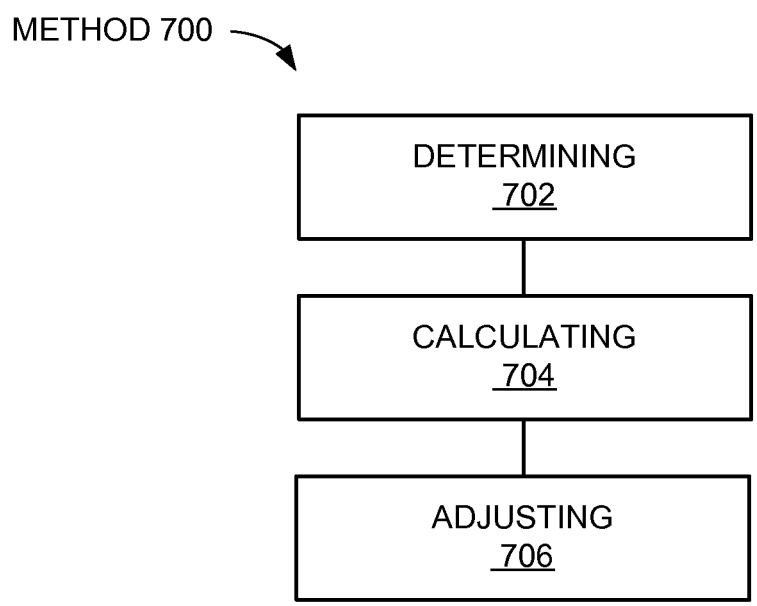
FIG. 7 is a flow chart of a method of operation of a storage control system in a further embodiment of the present invention.

Referring now to FIG. 7, therein is shown a flow chart of a method 700 of operation of a storage control system in a further embodiment of the present invention. The method 700 includes: determining a bit error rate of a page in a block 702; calculating a slope based on the bit error rate in a block 704; and adjusting a threshold voltage for the page based on the slope for reading a memory device in a block 706.

Thus, it has been discovered that the storage control system of the present invention furnishes important and heretofore unknown and unavailable solutions, capabilities, and functional aspects for a storage control system with data management mechanism. The resulting method, process, apparatus, device, product, and/or system is straightforward, cost-effective, uncomplicated, highly versatile, accurate, sensitive, and effective, and can be implemented by adapting known components for ready, efficient, and economical manufacturing, application, and utilization.

Another important aspect of the present invention is that it valuably supports and services the historical trend of reducing costs, simplifying systems, and increasing performance.

These and other valuable aspects of the present invention consequently further the state of the technology to at least the next level.

While the invention has been described in conjunction with a specific best mode, it is to be understood that many alternatives, modifications, and variations will be apparent to those skilled in the art in light of the aforegoing description. Accordingly, it is intended to embrace all such alternatives, modifications, and variations that fall within the scope of the included claims. All matters hithertofore set forth herein or shown in the accompanying drawings are to be interpreted in an illustrative and non-limiting sense.

What is claimed is:

1. A method of operation of a storage control system comprising:
   determining a bit error rate of a page in an erase block;
   calculating a slope based on the bit error rate of one or more pages of the erase block; and
   adjusting a threshold voltage for reading the page of the erase block based on the slope.

2. The method as claimed in claim 1 wherein adjusting the threshold voltage includes adjusting the threshold voltage with a threshold change value based on the slope and an age of the erase block.

3. The method as claimed in claim 1 further comprising estimating a target bit error rate for adjustment of the threshold voltage.

4. The method as claimed in claim 1 wherein adjusting the threshold voltage includes adjusting the threshold voltage based on where the page is located within the erase block.

5. The method as claimed in claim 1 wherein:
determining the bit error rate includes determining bit error rates for the slope based on a beginning page and an ending page of the erase block; and
further comprising:
estimating an age of the erase block based on a change of a difference in the bit error rates.

6. The method as claimed in claim 1 further comprising estimating a target bit error rate by sampling a mid-point page of the erase block for adjustment of the threshold voltage.

7. The method as claimed in claim 1 wherein adjusting the threshold voltage includes increasing the threshold voltage by a threshold change value when reading a beginning page of the erase block and decreasing the threshold voltage by the threshold change value when reading an ending page of the erase block.

8. The method as claimed in claim 1 wherein:
determining the bit error rate includes determining bit error rates for calculating the slope based on a beginning page and an ending page of the erase block; and
further comprising:
estimating an age of the erase block based on a change of a difference in the bit error rates and a change in the threshold voltage.

9. A storage system comprising:
a controller, coupled to non-volatile storage, the controller including one or more processors for executing software instructions stored in memory of the storage system;
a measurement module for determining a bit error rate of a page in an erase block of the non-volatile storage;
a calculation module, coupled to the measurement module, for calculating a slope based on the bit error rate of one or more pages of the erase block; and
an adjustment module, coupled to the calculation module, for adjusting a threshold voltage for reading the page of the erase block based on the slope.

10. The system as claimed in claim 9 wherein the adjustment module is for adjusting the threshold voltage with a threshold change value based on the slope and an age of the erase block.

11. The system as claimed in claim 9 further comprising a rate estimation module, coupled to the calculation module, for estimating a target bit error rate for adjustment of the threshold voltage.

12. The system as claimed in claim 9 wherein the adjustment module is for adjusting the threshold voltage based on where the page is located within the erase block.

13. The system as claimed in claim 9 wherein:
the measurement module is for determining bit error rates for the slope based on a beginning page and an ending page of the erase block; and
further comprising:
an age estimation module, coupled to the measurement module, for estimating an age of the erase block based on a change of a difference in the bit error rates.

14. The system as claimed in claim 9, wherein the adjustment module is for adjusting the threshold voltage with a threshold change value based on the slope, and an age of the erase block.

15. The system as claimed in claim 9, further comprising a rate estimation module, coupled to the calculation module, for estimating a target bit error rate by sampling a mid-point page of the erase block for adjustment of the threshold voltage.

16. The system as claimed in claim 9, wherein the adjustment module is for increasing the threshold voltage by a threshold change value when reading a beginning page and decreasing the threshold voltage by the threshold change value when reading an ending page.

17. The system as claimed in claim 9, wherein:
the measurement module is for determining bit error rates for calculating the slope based on a beginning page and an ending page of the erase block; and
further comprising:
an age estimation module, coupled to the measurement module, for estimating an age of the erase block based on a change of a difference in the bit error rates and a change in the threshold voltage.

18. The system as claimed in claim 9, further comprising said non-volatile storage.

19. The system as claimed in claim 9, further comprising:
a retention estimation module for determining an amount of correct data after a predetermined period of time.

* * * * *